United States Patent
De Bock et al.

(10) Patent No.: US 9,913,411 B2
(45) Date of Patent: Mar. 6, 2018

(54) THERMAL CAPACITANCE SYSTEM

(71) Applicant: GENERAL ELECTRIC COMPANY, Schenectady, NY (US)

(72) Inventors: Hendrik Pieter Jacobus De Bock, Clifton Park, NY (US); John Anthony Vogel, Charlton, NY (US); Naveenan Thiagarajan, Latham, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/139,440

(22) Filed: Apr. 27, 2016

(65) Prior Publication Data
US 2017/0318710 A1 Nov. 2, 2017

(51) Int. Cl.
*H05K 7/20* (2006.01)
*H01L 23/473* (2006.01)

(52) U.S. Cl.
CPC ..... *H05K 7/20881* (2013.01); *H05K 7/20336* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| 4,203,489 A | 5/1980 | Swiadek |
| 6,301,332 B1 | 10/2001 | Rogers et al. |

(Continued)

OTHER PUBLICATIONS

Goswami, et al., "Analysis of Thermal Energy Storage in Cylindrical PCM Capsules Embedded in a Metal Matrix," Energy Conversion Engineering Conference, 1990. IECEC-90 Proceedings of the 25th Intersociety, Aug. 12-17, 1990, vol. 4, pp. 257-262.

(Continued)

*Primary Examiner* — Anthony Haughton
*Assistant Examiner* — Razmeen Gafur
(74) *Attorney, Agent, or Firm* — Nitin N. Joshi

(57) ABSTRACT

A system for cooling electronics includes at least two modular thermal energy storage cards stacked in one of a horizontal or a vertical stack, where the stack provides cooling to a portion to electronics. The cards include: a thermally conductive enclosure bounding an interior cavity, a cell wall structure that includes cells disposed within the interior cavity and in thermal communication with the thermally conductive enclosure, a phase change material having a melting point where the phase change material disposed within the cells and in thermal communication with cell walls of the cells, and a thermally conductive interface disposed between the thermally conductive enclosure and a portion of the electronics that includes a heat generating surface. The thermally conductive interface extends from the interior cavity a distance beyond the interior cavity of the enclosure and is in contact with the heat generating surface.

20 Claims, 9 Drawing Sheets

(56) References Cited

U.S. PATENT DOCUMENTS

| | | | |
|---|---|---|---|
| 6,678,159 B1* | 1/2004 | Barcley | H05K 7/20545 165/185 |
| 7,086,247 B2 | 8/2006 | Campbell et al. | |
| 7,859,844 B2 | 12/2010 | Nguyen et al. | |
| 8,464,535 B2 | 6/2013 | White et al. | |
| 9,476,651 B2 | 10/2016 | Thiagarajan et al. | |
| 2005/0103473 A1* | 5/2005 | Todd | F28D 15/0275 165/104.11 |
| 2006/0060328 A1* | 3/2006 | Ewes | H01L 23/427 165/80.2 |
| 2007/0247813 A1* | 10/2007 | Colbert | H01L 23/4006 361/707 |
| 2009/0090109 A1 | 4/2009 | Mills et al. | |
| 2009/0151900 A1* | 6/2009 | Huang | H01L 23/3672 165/80.3 |
| 2010/0051227 A1 | 3/2010 | Anbudural | |
| 2010/0109137 A1* | 5/2010 | Sasaki | H01L 23/367 257/684 |
| 2010/0212656 A1 | 8/2010 | Qiu et al. | |
| 2011/0168159 A1 | 7/2011 | Lataperez et al. | |
| 2011/0279969 A1* | 11/2011 | Memon | G06F 1/20 361/679.47 |
| 2011/0279970 A1* | 11/2011 | Guan | G06F 1/20 361/679.47 |
| 2012/0107662 A1 | 5/2012 | Roemmler et al. | |
| 2012/0155015 A1* | 6/2012 | Govindasamy | G06F 1/203 361/679.46 |
| 2012/0319410 A1 | 12/2012 | Ambrosek et al. | |
| 2013/0003307 A1* | 1/2013 | Jang | H02S 40/34 361/709 |
| 2013/0056170 A1 | 3/2013 | Klemencic | |
| 2013/0077245 A1* | 3/2013 | Gradinger | F28D 1/035 361/700 |
| 2013/0107455 A1* | 5/2013 | Cottet | H05K 7/20672 361/694 |
| 2013/0170142 A1* | 7/2013 | Weaver, Jr. | H01L 23/427 361/701 |
| 2013/0265722 A1* | 10/2013 | Hill | G06F 1/203 361/707 |
| 2013/0308279 A1* | 11/2013 | Kim | H01L 23/373 361/720 |
| 2013/0322024 A1* | 12/2013 | Tantolin | H05K 7/2039 361/721 |
| 2014/0016264 A1* | 1/2014 | Chen | F28F 13/12 361/679.47 |
| 2014/0060771 A1 | 3/2014 | Bell et al. | |
| 2014/0078673 A1* | 3/2014 | Vincent | H05K 7/20336 361/700 |
| 2014/0102662 A1 | 4/2014 | Grama et al. | |
| 2014/0104787 A1* | 4/2014 | Chainer | H01L 23/40 361/690 |
| 2014/0154539 A1 | 6/2014 | Kwok et al. | |
| 2014/0233174 A1* | 8/2014 | Demange | H05K 7/20218 361/679.47 |
| 2014/0268969 A1* | 9/2014 | Crouch | H02M 7/003 363/141 |
| 2014/0334104 A1* | 11/2014 | Yang | H05K 5/0047 361/709 |
| 2014/0362590 A1* | 12/2014 | Chen | H05K 1/0206 362/373 |
| 2014/0368992 A1* | 12/2014 | Strader | H01L 23/3675 361/679.54 |
| 2016/0124474 A1* | 5/2016 | So | G06F 1/20 361/679.52 |
| 2016/0305279 A1 | 10/2016 | Gerstler et al. | |
| 2017/0064868 A1 | 3/2017 | Rush et al. | |
| 2017/0067693 A1 | 3/2017 | Rush et al. | |

OTHER PUBLICATIONS

Miroslaw Zukowski, "Experimental Study of Short Term Thermal Energy Storage Unit Based on Enclosed Phase Change Material in Polyethylene Film Bag," Energy Conversion and Management, Jan. 2007, vol. 48, Issue 1, pp. 166-173.

Dukhan, et al, "An Improved PCM Heat Storage Technology Utilizing Metal Foam," Thermal and Thermomechanical Phenomena in Electronic Systems (ITherm), Jun. 2-5, 2010, pp. 1-7, Conference location: Las Vegas, Nevada.

* cited by examiner

THERMAL CAPACITANCE SYSTEM

TECHNICAL FIELD

The present disclosure generally relates to a system having an enhanced thermal management design and structure.

BACKGROUND

With the development of more sophisticated electronic components, systems are subject to increasingly demanding power density levels. The heat generated during operation of these components can degrade the performance and reliability of the overall system and can even cause system failure. Thus, thermal management is an important element of the design of electronic products as both performance reliability and life expectancy of electronic equipment are inversely related to the chip junction temperature of the equipment.

Contemporary aircraft use avionics to control the various equipment and operations for flying the aircraft. The avionics may be stored in an avionics chassis that protects the avionics from harsh environment conditions, including electrically shielding the avionics from electromagnetic interference (EMI), protecting the avionics from lightning strikes, dissipating the heat generated by the avionics.

Thermal management of electronics is a key element in electronics including, but not limited to, avionics, mining and transportation systems, especially in the event of loss of air cooling or in the event of sudden spikes in power. A reduction in overall thermal resistance of the system including the card and the chassis may be obtained by enhancing heat extraction, spreading, and convection techniques to dissipate the heat from the chip to the ambient using heat pipes, fin optimization for natural convection and forced convection techniques. The transient thermal response of a system is function of the heat input and the thermal resistance and capacitance of a system. In aviation electronics, higher thermal mass is sometimes used to achieve a stable thermal response to a changing boundary condition using a large heat sink. Phase change materials (PCM) such as waxes can be used as alternative to absorb dissipated thermal energy. Contrary to large heat sinks, PCMs employ a change in phase of a substance from solid to liquid or liquid to gaseous to absorb the heat. By using this latent heat absorption, PCMs are significantly more effective in theory at absorbing heat from electronics. However, the low thermal conductivity of PCMs has limited their applicability as it results in ineffectiveness in getting the heat in and out of a PCM material. In other research, thermal conductivity of the phase change materials are increased by the use of higher thermal conductivity additives. In other approaches the energy storage is used approach as system and a system is developed around the PCM. This PCM system can include use of simple metal fins submerged in the PCM and use of metal foams. While the use of heat transfer enhancement structures lower thermal resistance of the PCM system, only additives increase the thermal conductivity of the PCM. These PCM based thermal energy storage system approaches are applied to increase the surface contact area and hence increase "effective" thermal conductivity or reduce resistance.

SUMMARY

A further need exists to store heat from the system in the event of loss of supplied cooling air from the aircraft, thereby providing additional time for the avionics to perform its operation without compromising functionality. Therefore, as PCM is an effective thermal storage material, yet hindered by its heat conduction performance, a reduction in the effective thermal resistance of the PCM system is desirable.

Shortcomings of the prior art are overcome and additional advantages are provided through the provision, in one embodiment, of a system for transient cooling of electronics based on a novel PCM based thermal energy storage system with improved effective thermal resistance. The system includes, for example: a first modular thermal energy storage card stacked on top of or placed adjacent to a second modular thermal energy storage card such that the first modular thermal energy storage card and the second modular thermal energy storage card comprise one of a horizontal or a vertical stack, and wherein the stack provides cooling to electronics, the first modular thermal energy storage card and the second modular thermal energy storage card each comprising: a thermally conductive enclosure bounding an interior cavity; a cell wall structure comprising a plurality of cells disposed within the interior cavity and in thermal communication with the thermally conductive enclosure; a phase change material having a melting point, the phase change material disposed within the plurality of cells and in thermal communication with cell walls of the plurality of cells; a thermally conductive interface disposed between the thermally conductive enclosure and a portion of the electronics comprising a heat generating surface, the thermally conductive interface extending from the interior cavity a distance beyond the interior cavity of the enclosure and in contact with the heat generating surface.

In another embodiment, this system includes, for example: an electronic system comprising electronic components and a chassis, the chassis in thermal contact with components; a first modular thermal energy storage card and a second modular thermal energy storage card inserted into the chassis, the first modular thermal energy storage card stacked on top of or placed adjacent to the second modular thermal energy storage card such that the first modular thermal energy storage card and the second modular thermal energy storage card comprise one of a horizontal or a vertical stack, wherein the stack provides cooling to the electronic system, the first modular thermal energy storage card and the second modular thermal energy storage card each comprising: a thermally conductive enclosure bounding an interior cavity; a cell wall structure comprising a plurality of cells disposed within the interior cavity and in thermal communication with the thermally conductive enclosure; a phase change material having a melting point, the phase change material disposed within the plurality of cells and in thermal communication with cell walls of the plurality of cells; a thermally conductive interface disposed between the thermally conductive enclosure and the chassis, the thermally conductive interface extending from the interior cavity a distance beyond the interior cavity of the enclosure and in contact with the chassis.

In another embodiment, the system includes, for example: an electronic system comprising electronic components and a chassis, the chassis in thermal contact with components; a first modular thermal energy storage card and a second modular thermal energy storage card inserted into the chassis, the first modular thermal energy storage card placed adjacent to the second modular thermal energy storage card such that the first modular thermal energy storage card and the second modular thermal energy storage card comprise one of a horizontal stack, wherein the stack provides cooling to the electronic system, the first modular thermal energy storage card and the second modular thermal energy storage card each comprising: a thermally conductive enclosure bounding an interior cavity; a cell wall structure comprising a plurality of cells disposed within the interior cavity and in thermal communication with the thermally conductive enclosure; a phase change material having a melting point, the phase change material disposed within the plurality of cells and in thermal communication with cell walls of the plurality of cells; a thermally conductive interface, wherein the thermally conductive interface of the first modular thermal energy storage card is disposed between the thermally conductive enclosure of the first modular thermal energy storage card and the chassis and extending from the interior cavity of the first modular thermal energy storage card a first distance beyond the interior cavity of the enclosure of the first modular thermal energy storage card and in contact with the chassis, and wherein the thermally conductive interface of the second modular thermal energy storage card is disposed between the thermally conductive enclosure of the second modular thermal energy storage card and a heat generating surface of the first modular thermal energy storage card, the thermally conductive interface of the second modular thermal energy storage card extending from the interior cavity of the second modular thermal energy storage card a second distance beyond the interior cavity of the enclosure of the second modular thermal energy storage card and in contact with the heat generating surface of the first modular thermal energy storage card; and a frame, wherein the frame is fitted over the horizontal stack to secure the first modular thermal energy storage card and the second modular thermal energy storage card adjacent to each other, the frame comprising a thermal conductive material wherein the frame transfers heat from the first modular thermal energy storage card to the second modular thermal energy storage card.

BRIEF DESCRIPTION OF THE DRAWINGS

The foregoing and other features, aspects and advantages of this disclosure will become apparent from the following detailed description of the various aspects of the disclosure taken in conjunction with the accompanying drawings, wherein.

DETAILED DESCRIPTION

Enhanced thermal energy storage systems disclosed herein are adaptable to a variety of different applications while being adaptable across different electrical systems. The systems may have a very low thermal resistance and high thermal capacitance and achieve high thermal capacitance using an enhanced thermal energy storage system that performs at a system level in part by utilizing high conductivity interfaces and faces. The systems may also be developed for and utilized in multiple systems and applications without requiring customization of the basic modules, thus reducing the cost to test and license embodiments of the present invention.

Systems disclosed herein may have an enhanced thermal management capability, designed to offset the additional heat loads in the event of loss of cooling. The systems may comprise modular stacking of thermal energy storage (TES) cards with an enhanced interface for utilization in the cooling of electronic devices, including, but not limited to, those electronics utilized in avionics, mining, and transportation. TES cards that may be selected and grouped in the aforementioned modular stacks are comprised of Phase Change Materials (PCMs) with varying thermal properties, including, but not limited to, varying melting points. This variety of melting points enables the TES modules, each of which contain a PCM, but may or may not include the described enhanced heat transfer structure, in stacks to provide cooling for diverse electronics with varying critical temperatures. This adaptability comes from the modular nature of the solution, rendering it adaptable to a variety of different applications. An advantage of the systems disclosed herein is that while being adaptable across different electrical/electronic systems, the systems have a very low thermal resistance and high thermal capacitance. Another advantage is that the systems achieve high thermal capacitance using an enhanced thermal energy storage system that performs at a system level in part by utilizing high conductivity interfaces and faces. Another advantage is that they can be developed for and utilized in multiple systems and applications without requiring customization of the basic modules, thus reducing the cost to test and license the systems.

Figure 1A:
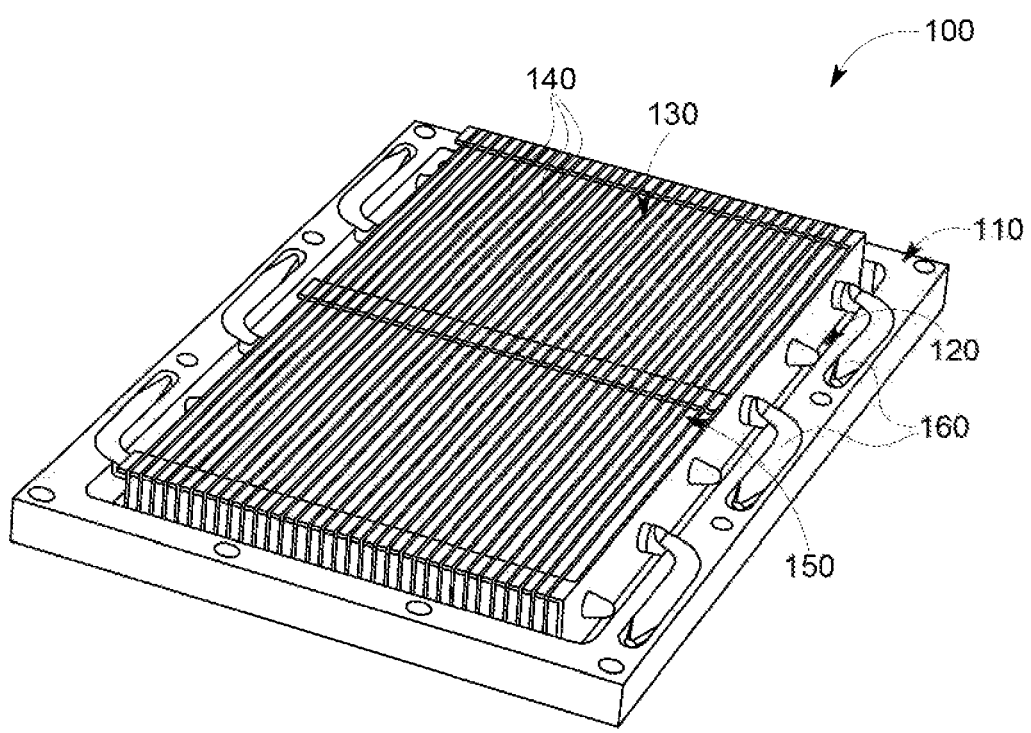
FIG. 1A is a schematic of a modular system that is designed to store dissipated thermal energy from a thermal source.
Figure 1B:
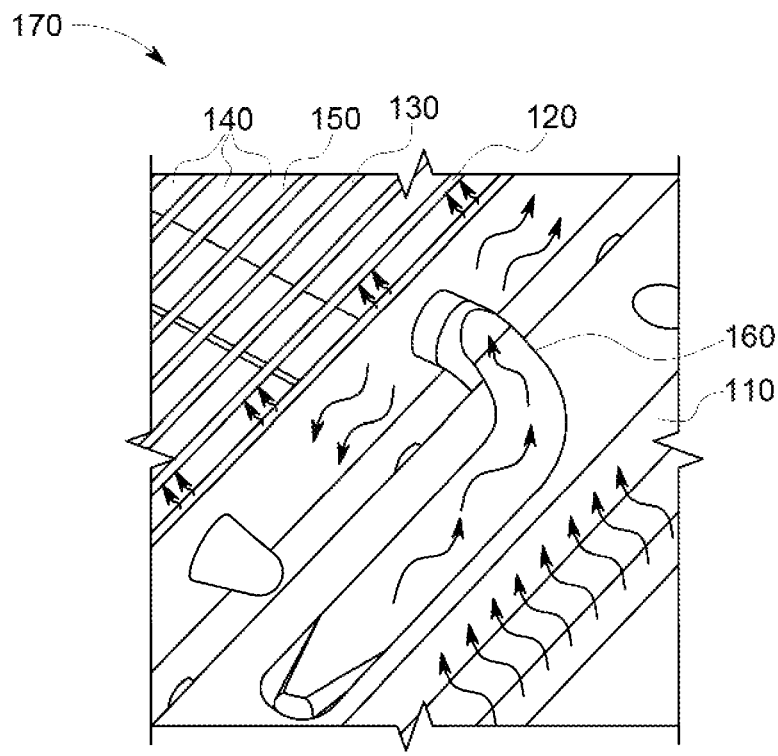
FIG. 1B is an illustration of certain functionality of the system of FIG. 1A.
Figure 1C:
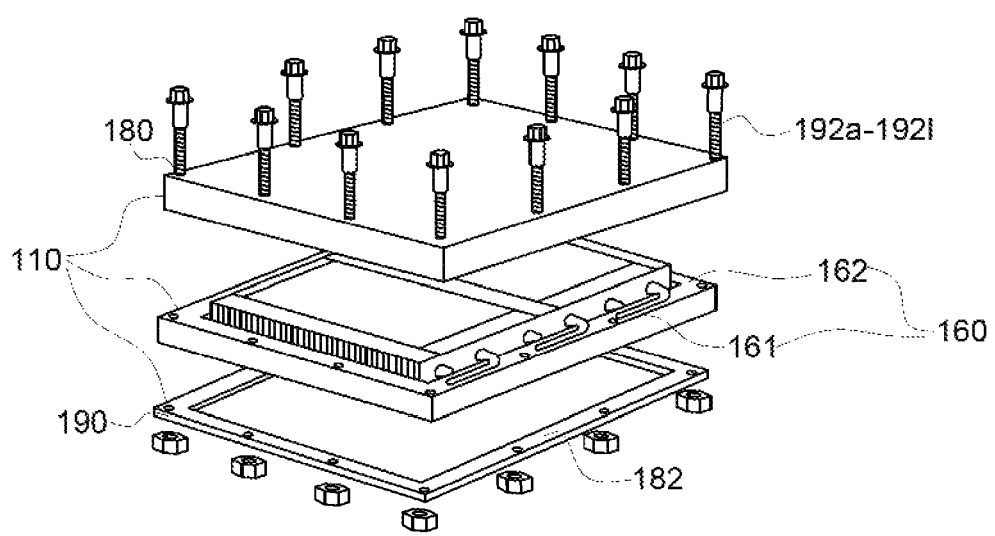
FIG. 1C is an exploded view of the system of the FIG. 1A.

As illustrated in FIGS. 1A-1C, although the internal structure of a TES card 100 can render its heat transfer properties more efficient, the systems may include PCMs with varying structures (including only a PCM), and still operate to cool electronics by utilizing the described modularity without these enhancements to the transfer of heat within the cavities 120 of the modules.

TES cards are modular building blocks (also referred to herein as both modular enhanced thermal energy storage cards and modular cards) with a thermally enhanced interface. As such, the modular building blocks can each be scaled up into rows and columns to obtain a matrix of modular cells to suit different shapes and power requirements. These modular cards or modules can be used, for example, in an avionics chassis as a 3U card by stacking two modular cards or a few of these cards can be embedded in the walls of an electronic enclosure for transient cooling applications.

A system may include a first modular thermal energy storage card stacked on top of or placed adjacent to a second thermal energy storage card such that the first modular thermal energy storage card and the second thermal energy storage card comprise one of a horizontal or a vertical stack, and wherein the stack provides cooling to a portion of a system or more than two of these modular thermal energy storage cards in a described stack. These modular thermal energy storage cards include a thermally conductive enclosure bounding an interior cavity, a cell wall structure comprising a plurality of cells disposed within the interior cavity and in thermal communication with the thermally conductive enclosure, a phase change material having a melting point, the phase change material disposed within the plurality of cells and in thermal communication with cell walls of the plurality of cells, and a thermally conductive interface disposed between the thermally conductive enclosure and a portion of electronics, the thermally conductive interface extending from the interior cavity a distance beyond the interior cavity of the enclosure and in contact with a portion of electronics comprising the portion of the system.

The thermally conductive interface may include a thermal conductor extending from the interior cavity to the thermally conductive enclosure and a heat generating surface in thermal contact with the portion of the electronics.

The portion of electronics may include a heat generating surface. The thermally conductive interface of a modular thermal energy storage card may include a heat pipe and/or a vapor chamber. A first modular thermal energy storage card and a second thermal energy storage card each include a wedgelock coupled to the enclosure and the thermally conductive interface is configured to circumvent utilizing the wedgelock to conduct heat to or from the portion of the electronics. The melting point of the phase change material of the first modular thermal energy storage card and the melting point of the phase change material of the second modular thermal energy storage card are not equal. The thermally conductive enclosure bounding the interior cavity of one or more of a modular thermal energy storage card includes an upper surface opposing a bottom surface. The thermally conductive interface of a modular thermal energy storage card includes a heat pipe embedded in the upper surface or the lower surface of the thermally conductive enclosure. The stack is horizontal (the modular thermal energy storage cards are oriented side-by-side) and the stack forms a thermal energy storage card for insertion into a chassis. The chassis is the heat generating surface. The chassis is referred to in this manner because heat eventually enters a TES card through the chassis walls and the heat is generated in the avionics that is transported along the chassis walls and into the TES card.

The modular thermal energy storage cards are stacked in a horizontal stack and the system includes a frame and the frame is fitted over the horizontal stack to secure the modular thermal energy storage cards together, adjacent to each other. The frame is comprised of a thermal conductive material and the frame transfers heat from the first modular thermal energy storage card to the second thermal energy storage card. The frame may serve as the lid of an electronics chassis or it may be a base plate upon which electronic components are laid out.

The modular thermal energy storage cards are stacked one on top of the other so a surface of the thermally conductive enclosure of the first modular thermal energy storage card is in thermal contact with the phase change material of the second thermal energy storage card.

This disclosure first describes various embodiments of TES cards and later describes embodiments of modular thermal capacitors in which the TES cards can be utilized. As will be described, TES cards are integrated into modular enhanced thermal energy storage cards and these modular enhanced thermal energy storage cards are stacked in various structures for use in cooling various electronics.

A system may also include multiple modular thermal energy storage cards stacked on top of or placed adjacent to each other forming one of a horizontal or a vertical stack. The stack provides cooling to a portion of a system and each modular thermal energy storage card includes a thermally conductive enclosure bounding an interior cavity, a cell wall structure comprising a plurality of cells disposed within the interior cavity and in thermal communication with the thermally conductive enclosure, a phase change material having a melting point, the phase change material disposed within the plurality of cells and in thermal communication with cell walls of the plurality of cells and a thermally conductive interface disposed between the thermally conductive enclosure and a portion of electronics, the thermally conductive interface extending from the interior cavity a distance beyond the interior cavity of the enclosure and in contact with a portion of electronics comprising the portion of the system.

FIG. 1A is a schematic representation of the internal heat transfer structure showing the plurality of cells bound by the metallic cell wall and the thermal conductor heat pipes. FIG. 1A shows a TES card 100, omitting the top cover 180 (FIG. 1C) and bottom cover 190 (FIG. 1C) in order to focus on an example of a heat transfer structure. It should be appreciated that FIG. 1A is an example of the structure of a TES card 100 and systems disclosed herein may utilize different heat transfer structures (or no heat transfer structure at all) with PCMs to cool electronics. A top cover 180 (FIG. 1C) and a bottom cover 190 (FIG. 1C) provide enhanced heat transfer structure of the TES cards. The enhanced heat transfer structure of the TES card 100 may include, and will be described in more detail later, a finned heat pipe structure 162 (FIG. 1C) into which a PCM can be embedded. Heat from a frame, e.g., thermally conductive enclosure 110, is transported to the center of the PCM by heat pipes and, in one example, heat is transferred from the heat pipe in the perpendicular direction by the fins. The path of heat transfer 170 is illustrated in FIG. 1B.

Referring to FIG. 1C, the top cover 180 and the bottom cover 190, together with the frame portion pictured in FIG. 1A, comprise the thermally conductive enclosure 110 of the TES card 110. A thermal conductor 160, includes a heat pipe 161 and a finned heat pipe 162. An O-ring gland 182 assists in securing the components of the TES card 100 as do screws 192*a*-192*l*.

Figure 2:
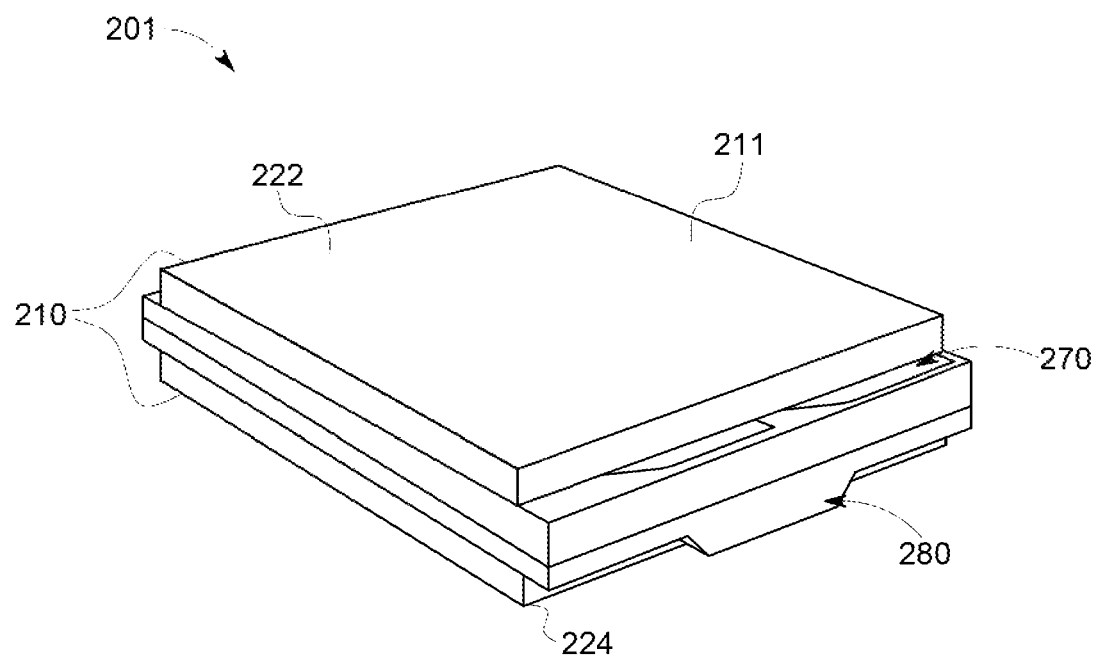
FIG. 2 is a perspective view of an aspect of a modular system that is designed to store dissipated thermal energy from a thermal source.
Figure 3:
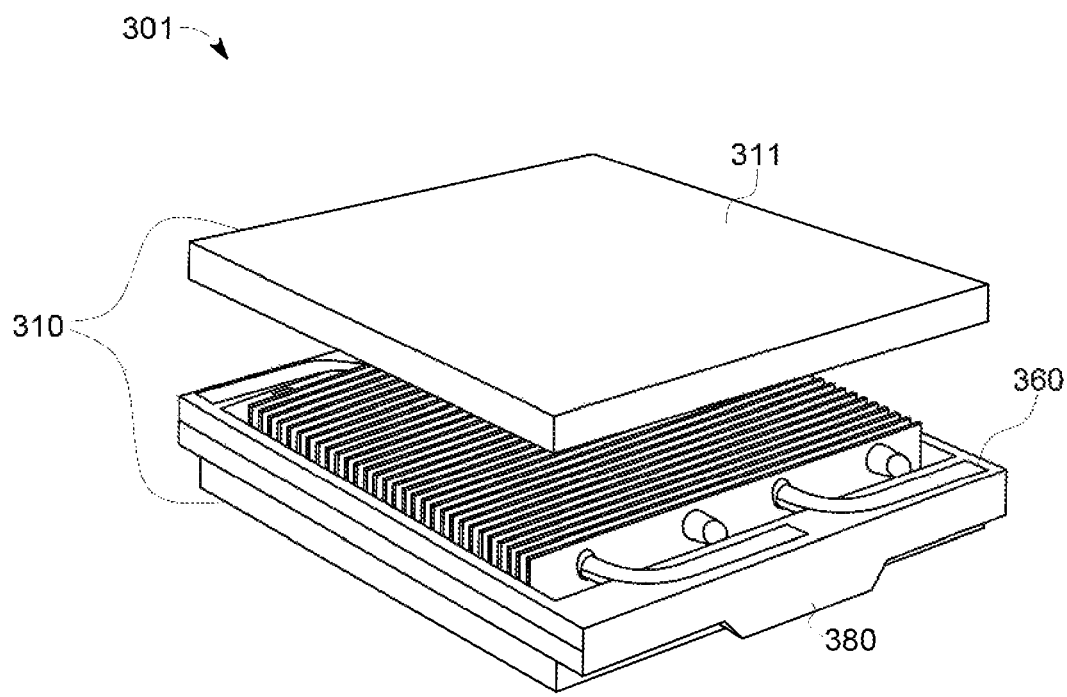
FIG. 3 is an exploded view of a modular system that is designed to store dissipated thermal energy from a thermal source.

TES cards are packaged into modular building blocks with a thermally enhanced interface. FIG. 2 depicts an example of a modular enhanced thermal energy storage card 201 (also referred to as a modular card) with high effective thermal conductivity (i.e., minimizing thermal resistance). The TES card 200 (e.g., TES card 100 in FIG. 1A) is enclosed in an enclosure 210 which comprises an enhanced interface 270 for utilization in the cooling of electronic devices and a wedgelock 280 (shown more completely as wedgelock 480, FIGS. 4A-4B) for positioning and/or securing the individual modular card 201 in the configurations discussed. FIG. 3 is an exploded view of the modular enhanced thermal energy storage card 301 of FIG. 2, and exposes the cavity on the TES card, which was illustrated in FIG. 1A.

Figure 4A:
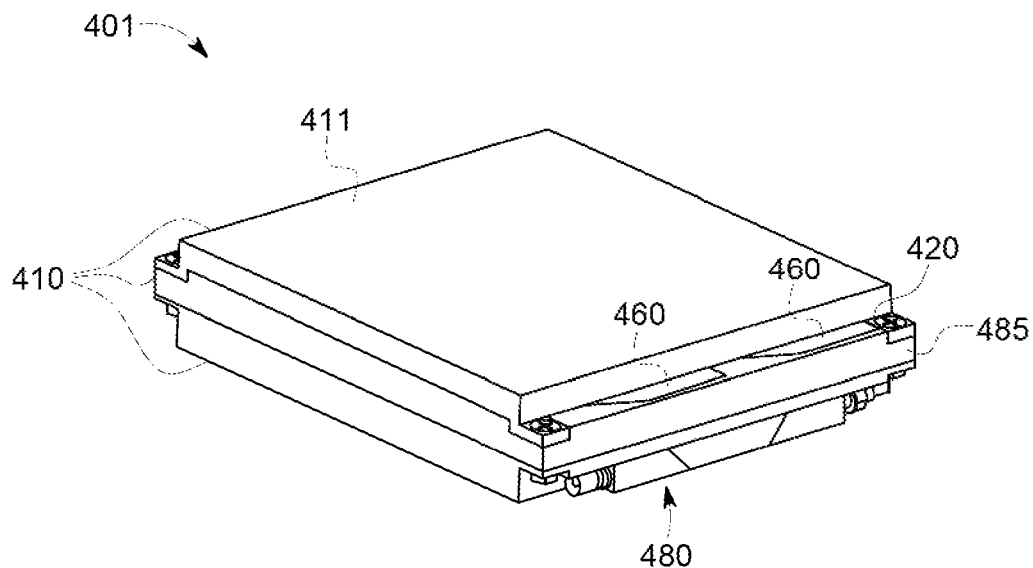
FIGS. 4A-4B illustrate a modular card that can be used in systems disclosed herein.
Figure 4B:
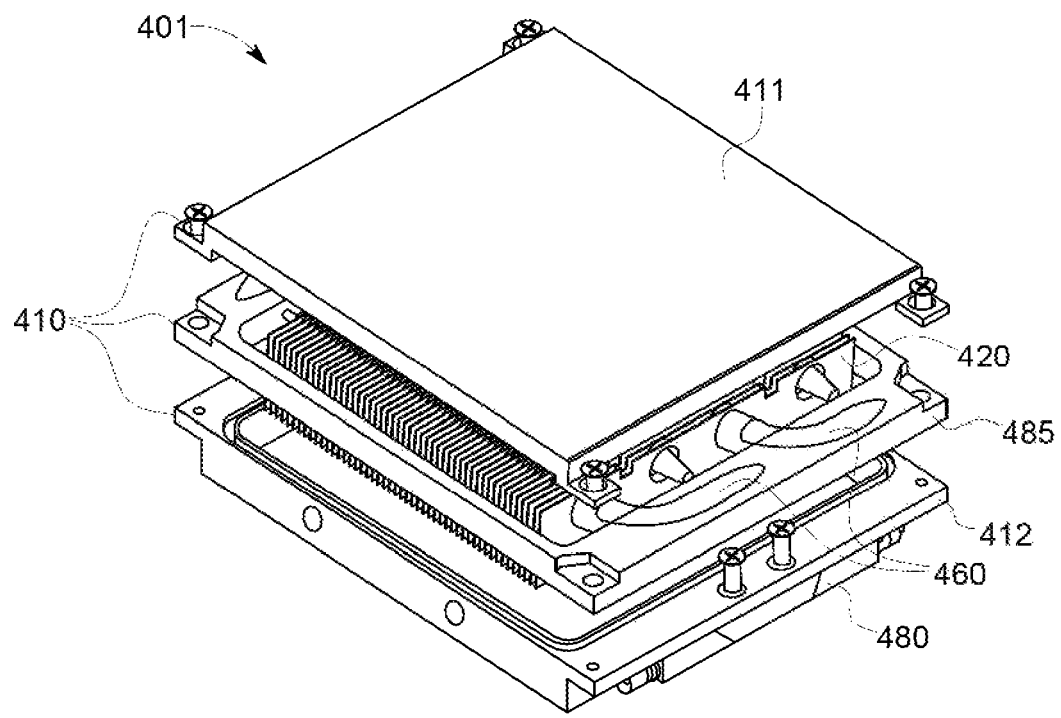

Referring to FIGS. 4A-4Ba modular card 401 may include a thermal conductor 460 that includes more than one exposed heat pipe surface that leads to the thermally conductive surface. Portions of the modular card 401 may be coupled using O-ring interfaces. The modular card 401 includes three parts, the top cover 411, the frame 485 that bounds the cavity 420 on the x and y plane, and a bottom cover 412 parallel to the top cover 411. A wedgelock 480 at the bottom of the enclosure 410 (which includes a cover 411) is optionally removable.

Figure 5A:
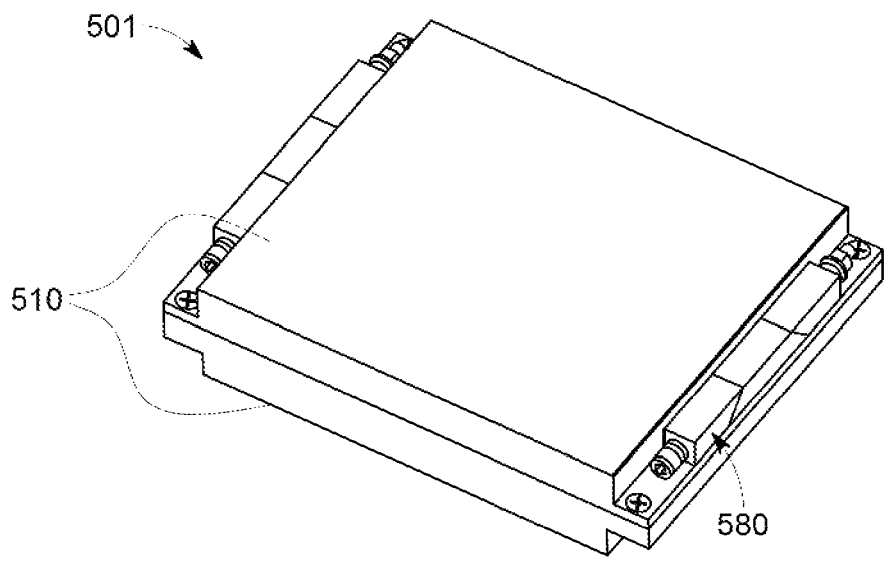
FIGS. 5A-5C illustrate a modular card that can be used in systems disclosed herein.
Figure 5B:
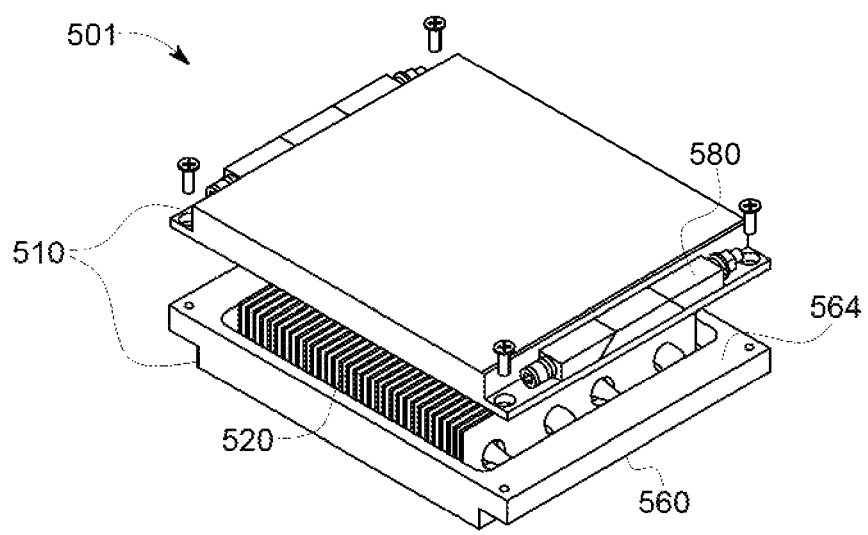
Figure 5C:
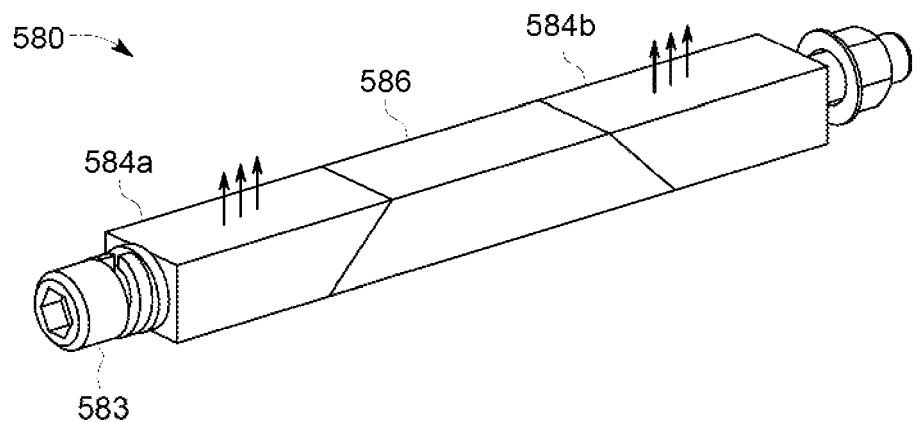
Figure 8:
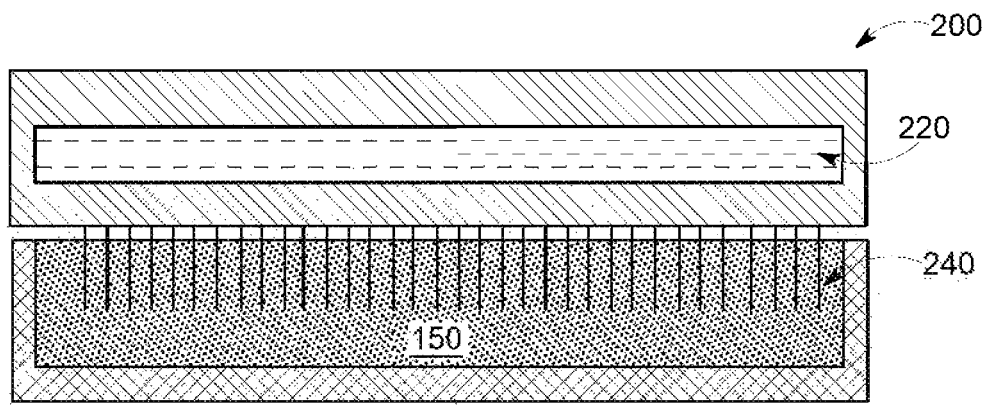
FIG. 8 provides a cross sectional view of an cell wall structure of the system of FIG. 1A having thermally conductive fins in the enclosure illustrated in FIG. 2.

Referring to FIGS. 5A-5B, the enclosure 510 bounding the cavity 520 includes two pieces, instead of the three parts of the embodiment illustrated in FIGS. 4A-4B. The thermal conductor 560 is a heat pipe that is buried a small distance (e.g., 0.55 mm) from the interface of the outer surface of the modular card 501 and a heat generating surface of the electronics this modular card 501 is assisting in cooling. The enclosure 510 may be sealed utilizing an O-ring 564 and/or permanently attached by bonding using an adhesive, soldering or brazing. The wedgelock 580 is on the top on the enclosure 510 and locks the modular card 501 into place. After inserting a modular card 501 into a chassis slot (as illustrated in FIG. 8), when the lead screw 583 is tightened from the end, the individual wedges 584a-584b rise up against the sloped interface of the central stationary piece 586. This rising exerts a force on the chassis wall (i.e., slot) and the reaction force holds the module in place.

Figure 6:
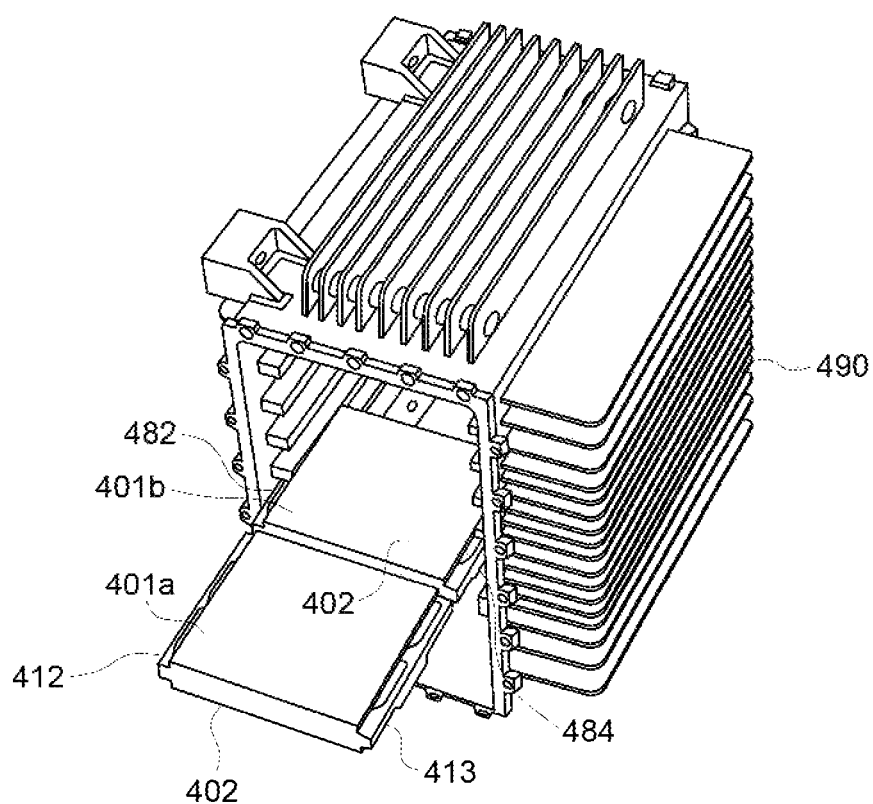
FIG. 6 illustrates a modular system that is designed to store dissipated thermal energy from a thermal source.

Referring to FIG. 6, modular cards 401a-401b (e.g., module 201, FIG. 2) can be stacked in an avionics chassis 490. The stacking and positioning of the modular cards 401a-401b enables efficient heat storage, which helps maintain the enclosing system, including but not limited to, the chassis 490, at a constant temperature (e.g., the melting point of the PCMs utilized in the TES cards in the modular cards 401a-401b). The modular aspect allows the modular cards 401a-401b, which can be compared to building blocks, to be scaled up into different shapes and forms. FIG. 6 illustrates one such shape and form as two modular cards 401a-401b are stacked besides each other to form a 3U avionics TES card 402. This modularity can be utilized in similar applications, including but not limited to, mining and transportation electronics for transient cooling needs.

Returning to FIG. 1A, a TES card 100 includes a structure that is designed to temporarily store dissipated thermal energy from any thermal source (not shown), such as, for example, electronic equipment. TES card 100 includes a thermally conductive enclosure 110 bounding an interior cavity 120. A cell wall structure 130, which may be metallic, is disposed within the cavity 120 in thermal communication with the enclosure 110, defining a plurality of cells 140. A phase change material 150 is disposed within the plurality of cells 140. As seen in FIG. 3, the enclosure 310 may include a cover 311. The enclosure 110 of the TES card 100 as illustrated in FIGS. 2-3 depicts embodiments of the TES card 200, 300 with in an enclosure 210, 310 that includes a cover 211, 311.

A TES card 100 may comprise an aluminum enclosure 110 of a rectangular structure with top and bottom covers (as illustrated in FIGS. 2-3) and defining a cavity 120. An aluminum cell wall structure 130 is placed within the cavity 120. The cell wall structure 130 includes fins, for example, of approximately 0.5 millimeters thickness with a spacing between the cell walls (that is, the "cell cavity width") of about 1.6 millimeters. A thermal conductor 160 comprising a copper heat pipe is placed in contact with the enclosure 110 and the cell wall structure 130, thus building a "finned heat pipe structure." In this example, this structure has about 75% porosity in the cavity 120. A commercial paraffin wax with a melting point of about 69° C. was filled in the available porosity. As discussed with respect to the modular card 200 of FIG. 2, an enhanced interface 270 is utilized rather than a thermal conductor 160, such as a copper heat pipe (e.g., FIG. 1A) and the enhanced interface 270 extends beyond the interior cavity of the enclosure 210 (FIG. 2). The enhanced interface 270 comprises thermal conductor-heat pipes, vapor chamber, graphite, or copper, which extends outside the interior cavity into the enclosure or the frame to form a high thermal conductivity interface Returning to FIG. 1A, the phase change material 150 also may be disposed outside of the cell wall structure 130 within the cavity 120, in addition to that disposed within the plurality of cells 140. The phase change material 150 may be disposed in all the porosity available in the cavity 120. In operation, heat is exchanged between the electronic equipment and the phase change material 150 of the TES card 100. If electronic equipment, as a heat source, is at a higher temperature than the phase change material 150, then heat will be transferred from the electronic equipment to the phase change material 150, thereby storing energy.

By contrast, if the electronic equipment is at a lower temperature than the phase change material 150 then heat will be transferred from the phase change material 150 to the electronic equipment, thereby releasing energy from TES card 100. The transfer of heat between the phase change material 150 and the electronic equipment is handled by the interface of the module into which the TES card is placed, and the electronic equipment. Thus, a TES module is in thermal communication with the electronic equipment In some embodiments, the TES card 100 disclosed herein provides a faster cooling rate for an electronic equipment from hereto known heat storage apparatuses by means of improved design of the TES card 100 components and the materials chosen for the same.

The enclosure 110 is a closed housing that contains the cell wall structure 130 and the phase change material 150. Only a frame 185 (e.g., FIG. 1C) portion of the enclosure 110 may be in contact with the phase change material 150 and the heat transfer structure, which may include a heat pipe. The frame 185 of the enclosure 110 and/or all the elements of the enclosure act as an interface for the heat exchange between the electronic equipment or other heat source and the phase change material 150. The enclosure 110 may heat up by receiving heat from the electronic equipment during thermal energy transfer from the electronic equipment to the phase change material 150 and during thermal energy transfer from the phase change material 150 to the electronic equipment. Therefore, a thermally conductive enclosure 110 is desired. As used herein, a "thermally conductive enclosure" is an enclosure that includes a thermally conductive element disposed to provide thermal communication between the exterior (i.e., the environment outside the enclosure) and interior of the enclosure. Examples of such a thermally conductive enclosure include an enclosure made entirely or partially of metallic or other thermally conductive material, or a thermal conductor such as a heat pipe, vapor chamber, graphite rods/plates, and/or conductive rod(s) embedded within the enclosure." Further, as used herein a "thermally conductive element" has an effective thermal conductivity of at least about 10 W/m-K. The enclosure 110 may be formed by copper or an alloy of copper, aluminum, magnesium, titanium, or any combinations thereof. The enclosure 110 may be made from an alloy of copper and molybdenum.

Heat is exchanged from an external heat source or heat sink through the enclosure 110. Heat is exchanged between the enclosure 110 and the phase change material 150. A thermal conductor 160 is disposed in thermal communication with the enclosure 110 and the cell wall structure 130 for the exchange of heat as shown in FIG. 1A. The thermal conductor 160 may include a heat pipe, vapor chamber, copper rod, aluminum rod, diamond rod, graphite conductor, or any combinations thereof. While any of these conductors is suitable, use of a heat pipe or vapor chamber typically offers enhanced conduction over monolithic conductors. In an embodiment of the present invention into which the TES card 100 is integrated, the thermal conductor 160, which as aforementioned may be a heat pipe, is extended outside both the TES card 100 and the aforementioned module into which the TES card 100 is placed, such that the thermal conductor 160 is in direct contact with the electronic system that the embodiment of the invention thermally regulates.

The thermal conductor 160 is a heat pipe with one end of the heat pipe embedded in the enclosure 110 for improved heat conduction. This structure is a departure from utilizing heat pipes to transfer heat from a fluid such as, for example, a liquid or air, to the phase change materials, as suggested in some previous systems. The thermal conductor 160 may be fabricated from aluminum, copper, or any other high thermal conductivity material. Improved heat conduction between the enclosure 110 and the thermal conductor 160 is promoted by conductive joining of the enclosure 110 and the heat pipe which comprises the thermal conductor 160. For instance, soldering, brazing, or a combination of these, with or without any other intervening ("filler") materials, may be used for enhancing the metallic contact and thereby reducing the thermal resistance between the heat pipe and the enclosure 110. Referring to FIG. 1C, the heat pipe 161 may be positioned to be flush against the frame 185 of the enclosure 110 as contact between the heat pipe 161 and the frame 185 enables the transfer of heat from the heat pipe 161 to this thermally conductive surface. The heat pipe 161 and the thermally conductive surface may be joined, for example, by epoxy.

The enclosure 110, thermal conductor 160, the cell wall structure 130, and the phase change material 150 within the cells are respectively disposed in thermal communication. The thermal conductor 160 is the primary heat conduction between the cell wall structure 130 and the enclosure 110, and the cell wall structure 130 is the primary heat conduction between the phase change material 150 and the thermal conductor 160. Hence, the phase change material 150 located inside the plurality of cells 140 exchanges heat with the thermal conductor 160, which may be a heat pipe 161 (e.g., FIG. 1C) through the cell wall structure 130, in contrast to prior art systems where heat pipes are used to transfer heat directly to the phase change material from the heat source.

The thermal conductor 160 may be a heat pipe that includes a working fluid (not shown) having a liquid to vapor transformation temperature in the operating temperature range of the TES card 100. Working fluid may be selected from a variety of two phase fluids depending upon the application, and the operating temperature range to be covered by the TES card 100. Such fluids may include, for example, water, ammonia, or organic liquids such as acetone, methanol, or ethanol.

The thermal conductor 160 may be a heat pipe that includes a wick like structure embedded in the inner walls of the heat pipe. In operation, heat is exchanged between the enclosure 110 and the cell wall structure 130 by the evaporation and condensation of the working fluid. For example, if the enclosure 110 is at a higher temperature than the phase change material 150, then heat is transferred from the enclosure to the cell wall structure 130 and phase change material 150, thereby storing energy in the phase change material 150. By contrast, if the enclosure 110 is at a lower temperature than the phase change material 150, then the heat is transferred from the phase change material 150 and cell wall structure 130 to the enclosure 110, thereby releasing energy from phase change material 150.

The thermally conductive enclosure 110 may be a monolithic conductor, such as a solid metal frame, or may have a heat-pipe-like structure in a part or whole of the enclosure. The enclosure 110 may include top and bottom parts (not shown) that are constructed from a thermally conductive material such as copper or aluminum and may provide a thermal path for heat to transfer from the electronic equipment.

Figure 7:
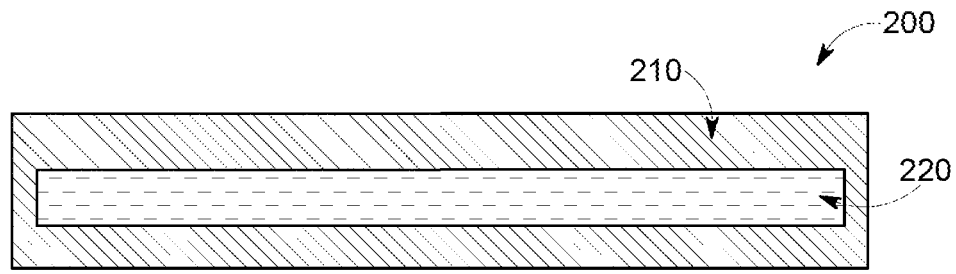
FIG. 7 is a cross-sectional view of an enclosure of system of FIG. 1A having a vapor chamber structure for an enhanced effective thermal conductivity.

Turning to FIG. 7, the enclosure 210 of the TES card 100 (FIG. 1A) is a 3-dimensional heat pipe designed as a vapor chamber having hollow and hermetically sealed structure. The vapor chamber 500 may have an enclosed wick structure 210 and be filled with a liquid 220. Liquid (alternately "condensable vapor") 220 evaporates upon exposure to heat, moves to the colder end, and condenses, thus aiding rapid spreading of heat in the enclosure 110 (FIG. 1A). A cover 311 (e.g., FIG. 3) of the enclosure 110 (FIG. 1A) that is in direct thermal communication with the electronic equipment has the disclosed vapor chamber 200 structure. The enclosure includes the vapor chamber structure in all the sides.

Phase change materials 150 as used herein are materials that have reversible phase change in the operating temperature range and are able to store latent heat at a particular temperature range. The phase change material 150 may absorb heat and change phase. The phase change material may include solid-liquid phase change, solid-solid phase change, liquid-vapor phase change, or a combination of any of these.

Solid-solid phase change materials undergo reversible solid-state crystal structure transitions at temperatures ranging from ambient up to about 100° C. The latent heat of liquefaction or latent heat of vaporization of the two-phase material may allow the material to absorb the heat at a constant temperature in an isothermal or nearly isothermal process. The two-phase material can thus provide a heat sink that absorbs heat without significantly increasing the temperature of the TES card 100. In an example, paraffin is used as a two-phase material inside the cavity. Paraffin may change from a solid state to a liquid state between ~10-100° C.

A modular stack may comprise TES cards with PCMs of varying thermal properties. The phase change material 150 of a TES card in a stack may comprise a variety of materials depending on the application and the operating temperature range. Materials include, but are not limited to, organic waxes, inorganic multi-phase metal alloys, eutectic salts, and other materials known in the art. Selection and quantity of phase change material 150 will depend upon the desired melting point and how much heat will need to be absorbed. Transition temperatures can be selected by forming solid solutions of different organic/inorganic compounds. Transition of these solid-solid phase change materials can occur over a fairly limited temperature range. Phase change material 150 may also be a blend of different compounds to obtain the desired phase transition temperature or range. Further, different types of phase change materials may be used in a single TES card 100, as well as within the stack of TES cards, to increase the temperature range over which the TES card 100 will be effective.

A two-component phase change material may be used as a phase change material. As used herein, a two-component phase change material is a material that changes into two different components during a phase change by absorbing heat. Hydrated salts are illustrative two-component phase change materials.

In general, hydrated salts tend to segregate into anhydrous salt and water when absorbing heat. Due to gravity, the molten salt tends to separate from the water and settle at the bottom. This may prevent the release of heat when the process is reversed. That is, when the heat is to be recovered from the melted and segregated salts by re-solidifying the hydrated salts, proper combination of salt and water is hindered due to the segregation and settling. Segregation and settling are major drawbacks of using hydrated salts as phase change materials. Abating these disadvantages increases the potential of using hydrated salts or any other two-component systems as phase change materials for thermal storage.

Thick metallic fins (sheet materials) may be used as the cell wall structure, providing an advantage of faster heat transfer as compared to very thin foils, which had been used in previous systems. Thick metallic fins enhance the thermal conduction and thereby penetration of heat into the energy storage device. The thickness of the cell walls may range from about 0.25 millimeters to about 2 millimeters, for example from about 0.25 millimeters to about 1 millimeter.

A cell wall structure 130 having a two phase heat transporter such as, for example, a heat pipe or a vapor chamber may be used to enhance the thermal conductivity. This enhanced conductivity aids in faster heat transfer between the enclosure 110 and the phase change material 150 as compared to the metallic fins or foils. The heat pipe structure or the vapor chamber structure used herein may include a two phase material and wick structure similar to or different from the previously disclosed vapor chamber structure 500 (FIG. 7) of the enclosure 110 or the heat pipe structure of the thermal conductor 160.

Thermal conductivity between the enclosure 110 and the cell wall structure 130 may be enhanced by building the cell wall structure 130 integral with the enclosure 110, thereby providing a direct thermal path between the enclosure 110 and the cell wall structure 130, without any other interfacing thermal conductors. FIG. 8 provides cross sectional view of an illustrative cell wall structure having thermally conductive fins 240 integral with the enclosure 110 (FIG. 1A) that has a vapor chamber structure 200. The thermally conductive fins may comprise, for example, a graphite or carbon based material, metals, heat pipes and/or vapor chambers, as shown in FIG. 9.

Figure 9:
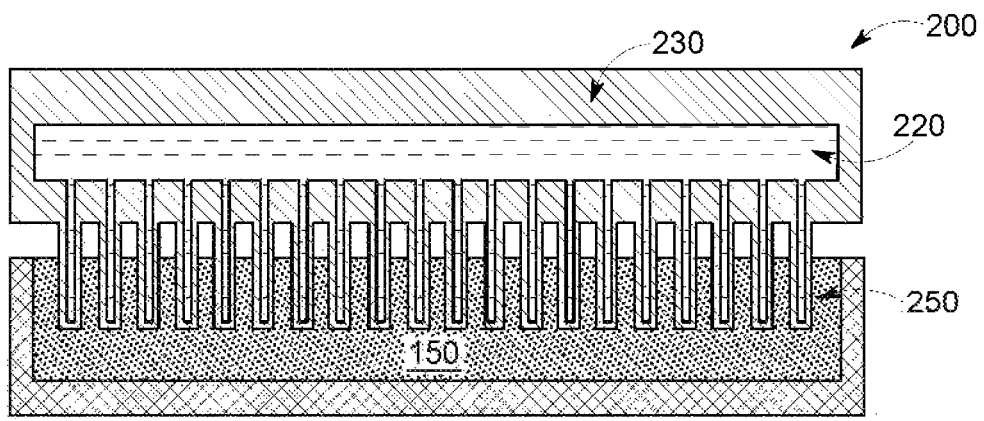
FIG. 9 is a cross-sectional view of the system of FIG. 1A that has an enclosure having a vapor chamber structure and an integral cell wall structure of a two phase heat transporter construction.

FIG. 9 is a cross sectional view of an illustrative cell wall structure having a two phase heat transporter 250 integral with the enclosure 110 having a vapor chamber structure 200. Heat may be received from electronic equipment at the top part 230 of the enclosure 200 and conducted throughout the integrated cell wall structure 130 through a common condensable vapor 220 thus transferring heat directly to the phase change material 150 using an interface of the walls of the cell wall structure 130 having the construction of two phase heat transporter 250 rather than utilizing a finned heat pipe. Referring to FIG. 7 and FIG. 8, a number of fin or two phase heat transporters arrangements may be employed including, for example, different two dimensional or three dimensional constructions of extending the fins or two phase heat transporters. Further, it should be appreciated that the metallic fins 240 may contact the top part 230 of enclosure 200 at the outermost cover (not shown), in the wick structure (not shown), or with the condensable vapor 220 depending on the material and structure of the enclosure and specific application requirements.

The overall volume of the cell wall structure 130 defines porosity of the cavity 120 inside the enclosure 110. This porosity is approximately the volume available for the phase change material 150 to be filled to store heat energy. Previous designs have suggested maximizing this porosity to store more phase change material. As high porosity as greater than 90% were used earlier in the effort to accommodate higher volume of phase change material. However, some embodiments of the present invention are directed to decreasing thermal resistance by the increment in fin area of cross-section and surface area, accommodating the decrease in porosity, and achieving increase in overall efficiency of the thermal storage.

In the TES cards disclosed herein, the overall cell porosity within the interior cavity is designed to be in a range from about 50% to about 88%, for example from about 70% to about 85%.

The cell wall structure 130 may further serve additional functions in the TES card 100 depending on the phase change material and the operating temperature range. The cell wall structure may include a coating that is anti-corrosive, hydrophilic, or having a combination of anti-corrosive and hydrophilic property. Further, the TES card 100 may include multiple cell wall structures 130 varying in the material, thickness, shape or functional enhancements. For example, the cell walls that directly receive heat from the thermal conductor 160 and distribute to the other parts of the cell wall structure 130 may have a thicker configuration compared to the cell walls that are in the interior and primarily exchange heat with the phase change material 150.

The cell wall structure 130 defines a plurality of cells 140 in the cavity 120. The cells 140 may comprise hundreds of cells housing the phase change material 150. In one embodiment, the cell wall structure 130 circumscribes about 5-50 cells per cubic centimeter. The cells are designed to maintain a small distance that heat must travel in the phase change material 150, thus minimizing the effect of the phase change material's typically low thermal conductivity on the overall thermal conduction within the TES card 100. Depending on the materials of the cell wall structure and the phase change material 150, the width of the cells 140 may vary from one system to another system. As used herein, the "width" of a cell is the width of that cell from the inside edge of one wall to the inside edge of the opposite wall. For example, if the cells 140 are designed to be of rectangular shape, then the width of the cells is the width of the inside cavity (alternately, "cell cavity") of the rectangular cell. The cells 140 may have a cell width less than about 5 millimeters, for example less than about 2 millimeters and greater than 0.5 millimeters.

Considering that the thermal conduction can happen from both the opposite walls to heat the phase change material 150 inside the cell, the thermal path inside the phase change material occupying the cell cavity is approximately equivalent to half the width of the cell ("half-cell thickness" or "half-cell width"). The half-cell width may be designed considering the thermal conductivity of the cell wall structure 130, thermal conductivity of the phase change material 150, and the desired rate of heat transfer to the entire phase change material 150. Therefore, the half-cell width is designed to reduce conduction path through phase change material 150 to a very thin layer and to eliminate the need for convection or for enhancement of the thermal conductivity of the phase change material 150. Therefore, design of the heat storage TES card 100 is compatible with multiple phase change materials 150 without the need for alteration of the phase change material 150. The TES card 100 can be designed to suit the phase change material 150 unlike previously described systems employing conduction through a randomly sized conductor, such as foam. The half-cell width of the plurality of cells may be from about 0.25 millimeters to about 1 millimeter, thereby making the cell width to be from about 0.5 millimeters to about 2 millimeters. A conduction length through the phase change material 150 may be less than about 0.8 millimeters.

A reduced conduction length through low thermally conductive phase change material would reduce time required to heat the phase change material. A rapid heating of the phase change material would result in low thermal gradient between the heat source and the phase change material 150, thereby enhancing the heat transfer from the heat source to the phase change material 150. An effective temperature difference between an exterior of the enclosure 110 and the phase change material 150 is decreased as compared to previously described systems.

Thickness and length of the cell wall structure 130, width of the plurality of cells 140, and the number of cells in the plurality of cells 140 define the surface area of the total cell wall structure 130. The increased surface area of the cell wall structure promotes increased thermal dissipation to the phase change material 150. It is desirable to increase the surface area of the cell wall structure 130, without unduly sacrificing the volume available for the phase change material 150. Corrugating the cell walls of the cell wall structure 140 is one such technique. In the TES card 100, a ratio of the surface area of the cell wall structure 130 to volume of the cavity may range from about 50 m2/m3-1500 m2/m3.

In various TES cards disclosed herein, a majority of volume of the phase change material is disposed in the plurality of cells 140 formed by the cell wall structure 130. This structure enables use of a two-component phase change material such as a hydrated salt, with decreased impact of phase segregation of the hydrated salts after melting. This helps in faster and more complete re-solidification of the two-component materials. Hence the cell wall structure 130 and the plurality of cells 140 improve process stability and repeatability of the phase change material.

Referring again to FIGS. 2-4, a multi-level thermal capacitance system includes more than one TES card, which is integrated into an enclosed module selected to optimize the transient response of systems. As depicted in FIG. 6, more than one modular card 401a-401b, which may comprise PCMs with melt points at different levels, may be used to increase the life expectancy and efficiency of the electronics to which they are thermally coupled. The variations in the melt points of the modular cards 401a-401b is advantageous because products that include electrical components often contain many materials with dissimilar coefficient of thermal expansion. By utilizing modular cards 401a-401b with varying melting points, the maximum and minimum temperature excursions that the product will experience are reduced, which reduces ramp rates to allow for relaxation in the materials and reduced stress.

The multi-TES system can build ladder functions where a multitude of TES modules (cards) are selected such that they have melt points at linear or logarithmic intervals, reducing the stress build up as a short relaxation time is given at each new interval.

Figure 10:
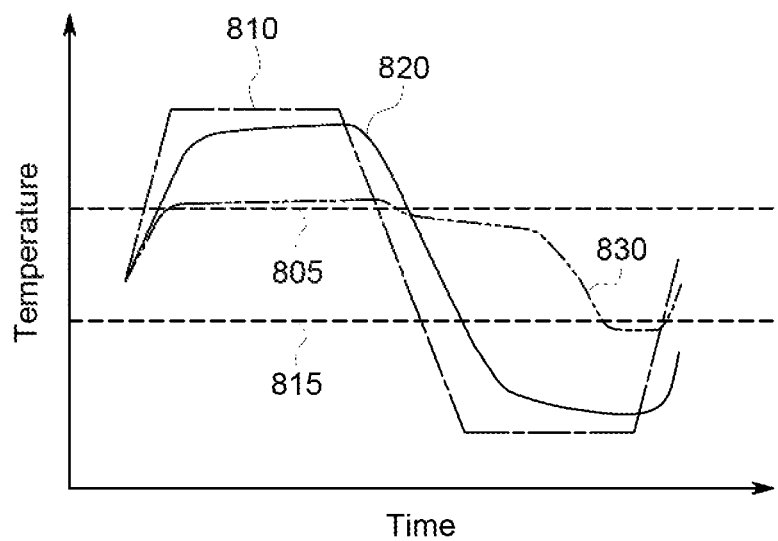
FIG. 10 is a graph that illustrates certain advantages of utilizing a system disclosed herein.

FIG. 10 illustrates certain of the advantages of utilizing a system comprising multiple modular cards 401a-401b (FIG. 6) with PCMs of varied melting points. During ambient cycling 810 (e.g., sinusoidal, exponential, linear or any arbitrary profile as dictated by the application), the temperature changes over time. A system that does not utilize a modular card for thermal capacitance, including not utilizing PCMs in TES cards in the manner described, will experience a temperature fluctuation 820 that follows the ambient profile for temperature over time 810, lending to a higher thermal stress for the system than a system that utilizes a modular card to mediate the temperature fluctuations. Specifically, if the system (i.e., the electrical system) utilizes a modular card (e.g., FIG. 2, 201) the fluctuation in the temperatures experienced by the system during ambient cycling will be reduced. Specifically, the maximum and minimum temperatures experienced by the electronics will be less severe.

The system utilized to mediate the temperature of a given electrical/electronic system in FIG. 10 utilizes two modules, each comprising a PCM with a different melting point. The first PCM melting point 805 and the second PCM melting point 815 are both indicated in FIG. 10. Following the temperature fluctuation curve of the system utilizing the aforementioned modular cards (e.g., FIG. 6, 401a-401b) 830, one may observe that melting points of each module bound the temperature fluctuation because the system with PCM melts at the first PCMs melting point, the system with PCM freezes at the second PCM's melting point, and the system with PCM freezes at the first PCM's freezing point.

FIG. 10 provides an example of how a system can be utilized to increase system reliability due to reduced temperature fluctuation under ambient cycling (or transient power conditions). In a chassis, as shown in FIG. 6, different modular cards 401a-401b positioned in different slots may have varying critical temperatures. Thus, the benefits are best experienced by utilizing PCMs of different melting points, for thermal energy storage.

Returning to FIG. 3, each modular card 301 includes a conductor 160 (FIG. 1A) that is, in this example, a heat pipe 360. The heat pipe 360, which is part of the internal thermal enhancement structure described in FIG. 1A, is extended outside the modular card 301 (outside of the cavity) to make direct contact with a system to be cooled (not pictured), for example, a chassis. The heat pipe has a higher thermal conductivity (e.g., >20× copper) and hence heat is transferred to the PCM enclosed in the TES card 300 with a very low thermal resistance. The heat transferred between the structure, such as a heat pipe, in order to bypass transferring heat via a wedgelock 380 interface, which has a higher thermal resistance and may lead to higher temperatures. The integration of heat pipes enables bypassing the wedgelock 380, which is utilized to lock each modular card 301 in place, for example, in a stack. A heat pipe 360 may be situated either at a heat transfer surface or embedded below the surface.

One or more heat pipes 360 is positioned toward certain of the outer edges of each modular card 301, as the contact surfaces between the modular cards 301 and of the electronics are these edges 412, 413 (FIG. 6). For example, in FIG. 6, heat is assumed to enter the edges 412, 413 of the modular card 401a where the heat pipes are extended from the avionic chassis 490 because in the avionics chassis 490 (FIG. 6), the contact surfaces 482, 484, come into contact with these edges 412, 413, when a modular card 401a-401b is tacked into the chassis 490.

However, referring to FIG. 2, the contact surfaces of the electronics may contact one or more of the top surface 222 or the bottom surface 224 of a module 201. Hence, heat pipes may be embedded in these surfaces of modules to carry the heat into the PCM of the TES card within.

Figure 11:
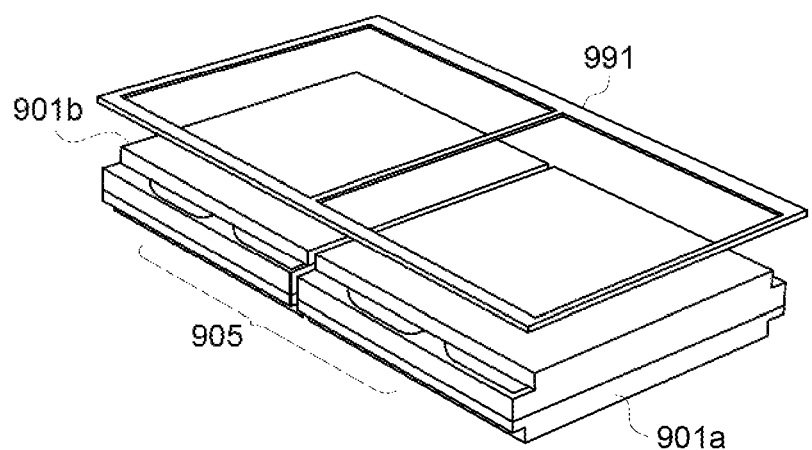
FIG. 11 depicts a tiled matrix of modular cards.
Figure 12:
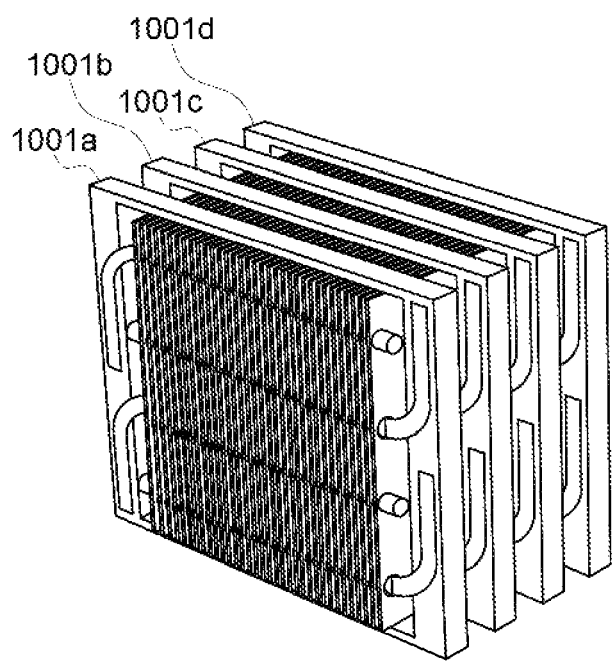
FIG. 12 depicts a configuration into which modular cards may be stacked.

Returning to FIG. 6, a stack configuration for the modular cards 401a-401b may be utilized. The modular cards may be stacked in different configurations. FIGS. 11-12 depict different configurations into which modular cards may be stacked. The stacked configuration utilized to mitigate temperature changes by providing thermal energy storage in a given electrical system can be dictated by the requirements and structure of the given electrical system. For example, FIG. 11 illustrates a tiled matrix 905 of modular cards 901a-901b that could be clicked in place on a frame 991. This tiled matrix 905 configuration of modular cards 901a-901b could be used as a cover or wall based application.

The frame 991 may be comprised of different materials, including but not limited to, highly thermal conductive materials and/or heat pipes. Frame 991 may be embedded with heat pipes and/or may be part of a lid, for example, of an electronic chassis.

Frame 991, which is comprised of a material capable of transferring heat, transfers the heat from modules at the ends of stacks, and therefore in contact with heat emitting surfaces of electronics, and distributes the heat to the modules that are closer to the middle of the stacks, and therefore not in contact or as close proximity to the heat-generating surface of the electronics being cooled.

Referring to FIG. 12, for certain applications, TES cards 1000a-1000d (e.g., TES card 100, FIG. 1A), each without a cover (e.g., cover 211, FIG. 2, cover 311, FIG. 3) can be stacked in to PCM-filled walls of a chassis or any electronics box arrangement where these TES cards 1000a-1000d could be directly dropped into PCM filled walls of a chassis or any electronics enclosure. The TES cards 1000a-1000d could be re-stacked in any of the three directions depending on the demands of the application.

The invention claimed is:

1. A system, comprising:
   a first modular thermal energy storage card stacked on top of or placed adjacent to a second modular thermal energy storage card such that the first modular thermal energy storage card and the second modular thermal energy storage card comprise one of a horizontal or a vertical stack, and wherein the stack provides cooling to electronics, the first modular thermal energy storage card and the second modular thermal energy storage card each comprising:
   a thermally conductive enclosure bounding an interior cavity;
   a cell wall structure comprising a plurality of cells disposed within the interior cavity and in thermal communication with the thermally conductive enclosure;
   a phase change material having a melting point, the phase change material disposed within the plurality of cells and in thermal communication with cell walls of the plurality of cells;
   a thermally conductive interface disposed between the thermally conductive enclosure and a portion of the electronics comprising a heat generating surface, the thermally conductive interface extending from the interior cavity a distance beyond the interior cavity of the enclosure and in contact with the heat generating surface.

2. The system of claim 1, wherein the thermally conductive interface comprises a thermal conductor.

3. The system of claim 1, the thermally conductive interface of one or more of the first modular thermal energy storage card or the second modular thermal energy storage card comprising at least one of: a heat pipe, a vapor chamber, or a graphite rod.

4. The system of claim 1, the first modular thermal energy storage card and the second modular thermal energy storage each further comprising a wedgelock coupled to the enclosure, wherein the thermally conductive interface is configured to circumvent utilizing the wedgelock to conduct heat to or from the portion of the electronics.

5. The system of claim 1, the melting point of the phase change material of the first modular thermal energy storage card and the melting point of the phase change material of the second modular thermal energy storage card not being equal.

6. The system of claim 1, wherein the thermally conductive enclosure bounding the interior cavity of one or more of the first modular thermal energy storage card or the second modular thermal energy storage card comprises an upper surface opposing a bottom surface.

7. The system of claim 6, wherein the thermally conductive interface comprises a heat pipe embedded in at least one of the upper surface or the lower surface of the thermally conductive enclosure.

8. The system of claim 1, wherein the stack comprises a horizontal stack and the horizontal stack forms a thermal energy storage card for insertion into a chassis and the chassis comprises the heat generating surface.

9. The system of claim 1, wherein the stack comprises a horizontal stack and the system further comprises a frame, wherein the frame is fitted over the horizontal stack to secure the first modular thermal energy storage card and the second modular thermal energy storage card adjacent to each other.

10. The system of claim 9, the frame comprising a thermal conductive material wherein the frame transfers heat from the first modular thermal energy storage card to the second modular thermal energy storage card.

11. The system of claim 1, wherein the first modular thermal energy storage card is stacked on top of the second modular thermal energy storage such that a surface of the thermally conductive enclosure of the first modular thermal energy storage card is in contact with the phase change material of the second modular thermal energy storage card.

12. The system of claim 1, wherein the phase change material of first modular thermal energy storage card and the phase change material of the second modular thermal energy storage card each comprise one of: an organic wax, an inorganic multi-phase metal alloy, an eutectic salt.

13. The system of claim 1, wherein the overall cell porosity within the interior cavity of the first modular thermal energy storage card is in a range from about 50% to about 88%.

14. The system of claim 1, wherein a half-cell width of the plurality of cells of the first modular thermal energy storage card is in a range from about 0.25 millimeters to about 1 millimeter.

15. The system of claim 1 wherein a thickness of the cell wall structure of the first modular thermal energy storage card is in a range from about 0.25 millimeters to about 2 millimeters.

16. The system of claim 1, wherein the thermally conductive interface comprises a heat pipe.

17. A system comprising:
an electronic system comprising electronic components and a chassis, the chassis in thermal contact with components;
a first modular thermal energy storage card and a second modular thermal energy storage card inserted into the chassis, the first modular thermal energy storage card stacked on top of or placed adjacent to the second modular thermal energy storage card such that the first modular thermal energy storage card and the second modular thermal energy storage card comprise one of a horizontal or a vertical stack, wherein the stack provides cooling to the electronic system, the first modular thermal energy storage card and the second modular thermal energy storage card each comprising:
a thermally conductive enclosure bounding an interior cavity;
a cell wall structure comprising a plurality of cells disposed within the interior cavity and in thermal communication with the thermally conductive enclosure;
a phase change material having a melting point, the phase change material disposed within the plurality of cells and in thermal communication with cell walls of the plurality of cells;
a thermally conductive interface disposed between the thermally conductive enclosure and the chassis, the thermally conductive interface extending from the interior cavity a distance beyond the interior cavity of the enclosure and in contact with the chassis.

18. The system of claim 17, wherein the chassis comprises a heat generating surface.

19. The system of claim 17, the melting point of the phase change material of the first modular thermal energy storage card and the melting point of the phase change material of the second modular thermal energy storage card not being equal.

20. A system comprising:
an electronic system comprising electronic components and a chassis, the chassis in thermal contact with components;
a first modular thermal energy storage card and a second modular thermal energy storage card inserted into the chassis, the first modular thermal energy storage card placed adjacent to the second modular thermal energy storage card such that the first modular thermal energy storage card and the second modular thermal energy storage card comprise one of a horizontal stack, wherein the stack provides cooling to the electronic system, the first modular thermal energy storage card and the second modular thermal energy storage card each comprising:
a thermally conductive enclosure bounding an interior cavity;
a cell wall structure comprising a plurality of cells disposed within the interior cavity and in thermal communication with the thermally conductive enclosure;
a phase change material having a melting point, the phase change material disposed within the plurality of cells and in thermal communication with cell walls of the plurality of cells;
a thermally conductive interface,
wherein the thermally conductive interface of the first modular thermal energy storage card is disposed between the thermally conductive enclosure of the first modular thermal energy storage card and the chassis and extending from the interior cavity of the first modular thermal energy storage card a first distance beyond the interior cavity of the enclosure of the first modular thermal energy storage card and in contact with the chassis, and
wherein the thermally conductive interface of the second modular thermal energy storage card is disposed between the thermally conductive enclosure of the second modular thermal energy storage card and a heat generating surface of the first modular thermal energy storage card, the thermally conductive interface of the second modular thermal energy storage card extending from the interior cavity of the second modular thermal energy storage card a second distance beyond the interior cavity of the enclosure of the second modular thermal energy storage card and in contact with the heat generating surface of the first modular thermal energy storage card; and
a frame, wherein the frame is fitted over the horizontal stack to secure the first modular thermal energy storage card and the second modular thermal energy storage card adjacent to each other, the frame comprising a thermal conductive material wherein the frame transfers heat from the first modular thermal energy storage card to the second modular thermal energy storage card.

* * * * *